(12) United States Patent
Bingel et al.

(10) Patent No.: US 8,680,911 B2
(45) Date of Patent: Mar. 25, 2014

(54) HIGH-LINEARITY SIGNAL-PROCESSING AMPLIFIER

(75) Inventors: Thomas J. Bingel, Indian Rocks Beach, FL (US); Douglas E. Smith, Phoenix, AZ (US); Steven J. Sanders, Scottsdale, AZ (US); Deanne Tran Vo, Palm Harbor, FL (US); Craig G. Ross, Tarpon Springs, FL (US); Derek Mead, Scottsdale, AZ (US)

(73) Assignee: Honeywell International Inc., Morristown, NJ (US)

( * ) Notice: Subject to any disclaimer, the term of this patent is extended or adjusted under 35 U.S.C. 154(b) by 398 days.

(21) Appl. No.: 13/043,115

(22) Filed: Mar. 8, 2011

(65) Prior Publication Data

US 2012/0229811 A1 Sep. 13, 2012

(51) Int. Cl.
*H03L 5/00* (2006.01)
(52) U.S. Cl.
USPC .......................................................... 327/321
(58) Field of Classification Search
USPC .................. 356/460; 327/309, 318, 321, 323
See application file for complete search history.

(56) References Cited

U.S. PATENT DOCUMENTS

| 5,028,889 | A | | 7/1991 | Fedan | |
|---|---|---|---|---|---|
| 5,192,885 | A | * | 3/1993 | Gay | 327/309 |
| 5,381,106 | A | * | 1/1995 | Limberg | 327/104 |
| 5,521,555 | A | * | 5/1996 | Tazartes et al. | 330/308 |
| 5,793,241 | A | * | 8/1998 | Sanzo et al. | 327/323 |
| 5,856,760 | A | | 1/1999 | Lam et al. | |
| 6,621,321 | B2 | * | 9/2003 | Goldstein et al. | 327/321 |
| 6,744,519 | B2 | | 6/2004 | Lange et al. | |
| 6,794,921 | B2 | * | 9/2004 | Abe et al. | 327/309 |
| 7,489,199 | B2 | | 2/2009 | Szepesi | |
| 2009/0040526 | A1 | * | 2/2009 | Ward | 356/460 |

* cited by examiner

*Primary Examiner* — Michael A Lyons
*Assistant Examiner* — Rufus Phillips
(74) *Attorney, Agent, or Firm* — Fogg & Powers LLC

(57) ABSTRACT

A clamp-point active circuit is provided. The clamp-point active circuit includes a rate amplifier configured to receive an output from a device transitioning between at least two levels. The clamp-point active circuit has at least one switching device configured to receive an output from the rate amplifier. The at least one switching device is in at least one respective feedback loop of the rate amplifier. A switching of the at least one switching device causes the rate amplifier to amplify with high linearity in a desired operating range and to clamp outputs received from the transitioning device that are outside the desired operating range to a fixed level.

13 Claims, 11 Drawing Sheets

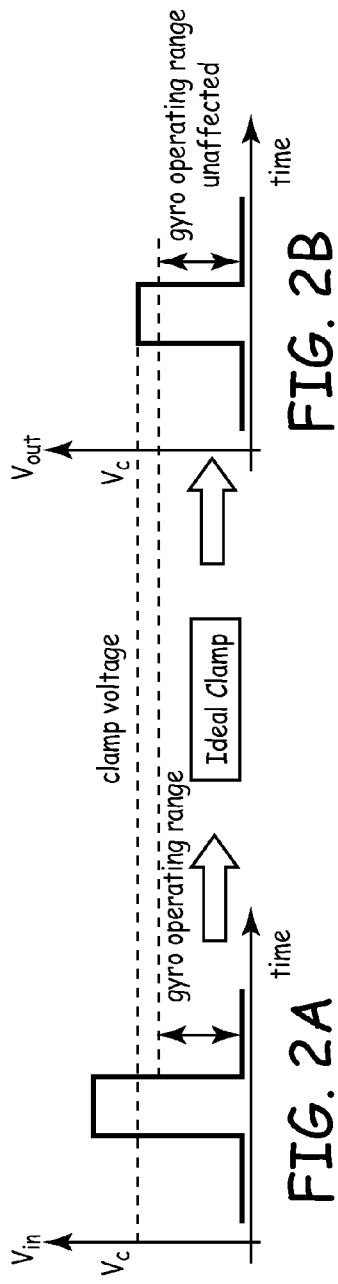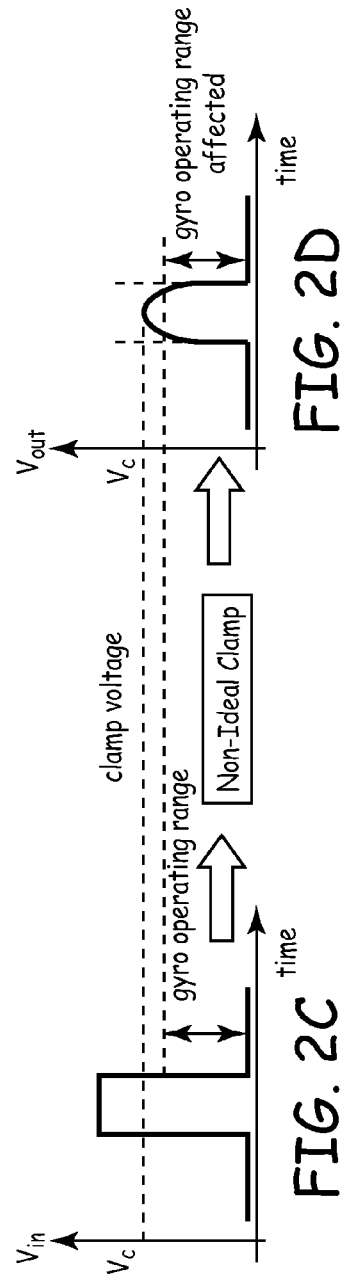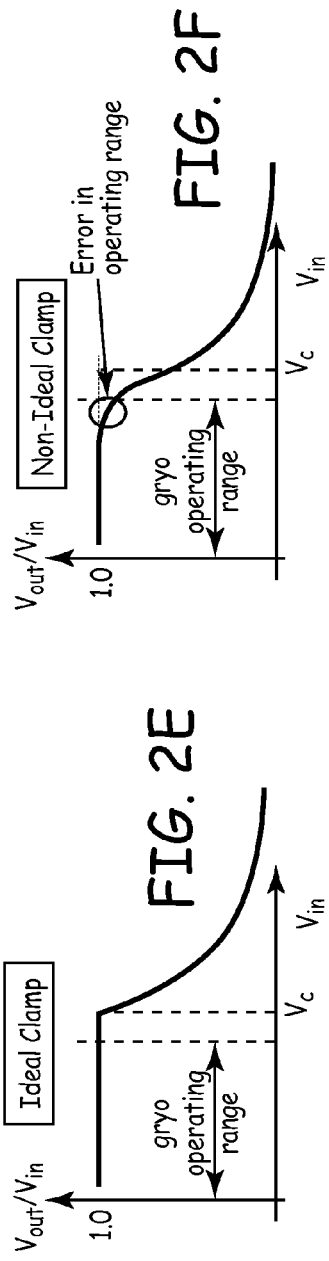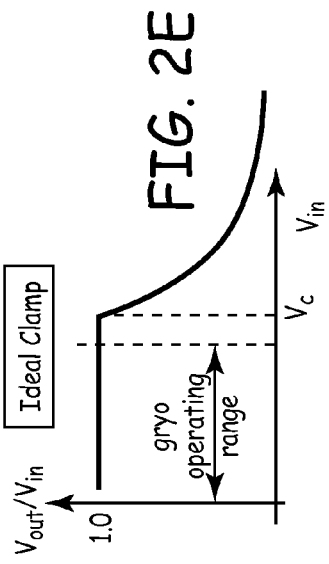

HIGH-LINEARITY SIGNAL-PROCESSING AMPLIFIER

BACKGROUND

In fiber optic gyroscopes (FOGs), rotation rate information is encoded in the optical phase shift between two waves counter-propagating through a fiber coil. The waves are then made to impinge together on a photodetector, where the rotation-induced phase determines the optical interference intensity and the resulting photocurrent. This electric current is then typically transimpedance-amplified into a voltage for signal processing, possibly with additional analog or digital gain applied. In high-performance FOGs, the voltage signal is generally amplified with as much gain as possible to maximize the ratio of rotation signal to noise.

Certain electronic components used in the signal processing path of the gyroscope can impose limits on the maximum usable gain. For example, many high-performance FOGs use an analog-to-digital converter (ADC) to digitize the photodetector signal. These ADCs often have rather narrow damage thresholds, limiting the safe input voltage range to, for example, 0V-5V. This limited safe input voltage range reduces the maximum gain that can be applied in the electronics chain leading up to the ADC.

Circuits currently available to clamp voltages to a safe input voltage range significantly distort the input voltage waveform and moreover permit large gyroscope transient events to end up in the acquisition region of the rate gyroscope circuit. Such distortion increases noise, bias modulation pick-up, scale factor nonlinearity, and other factors, which deteriorate the gyroscope performance.

SUMMARY

The present application relates to a clamp-point active circuit. The clamp-point active circuit includes a rate amplifier configured to receive an output from a device transitioning between at least two levels. The clamp-point active circuit has at least one switching device configured to receive an output from the rate amplifier. The at least one switching device is in at least one respective feedback loop of the rate amplifier. A switching of the at least one switching device causes the rate amplifier to amplify with high linearity in a desired operating range and to clamp outputs received from the transitioning device that are outside the desired operating range to a fixed level.

DRAWINGS

FIGS. 2A-2F show exemplary ideal and non-ideal clamping;

Figure 9:
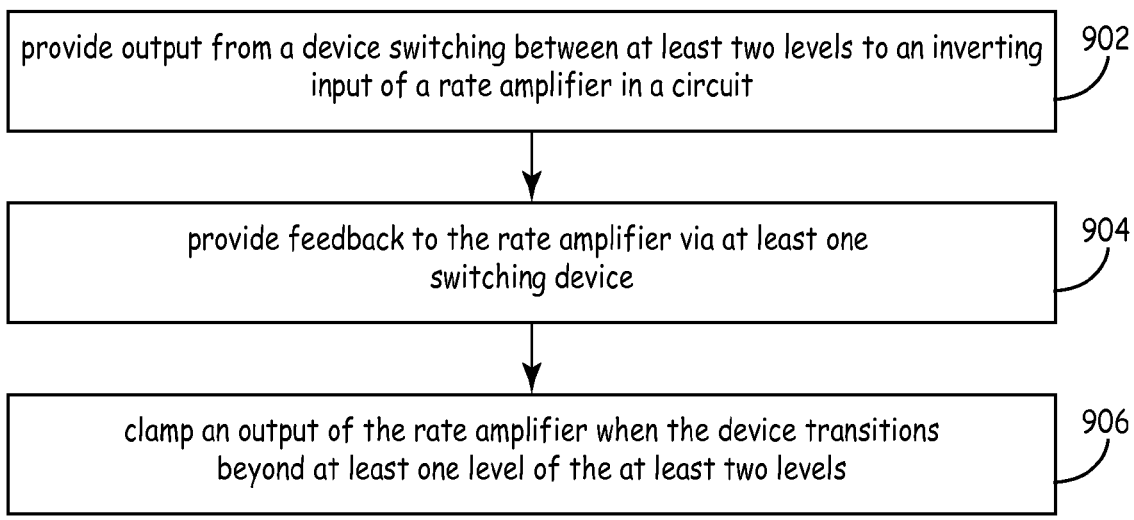
Figure 10:
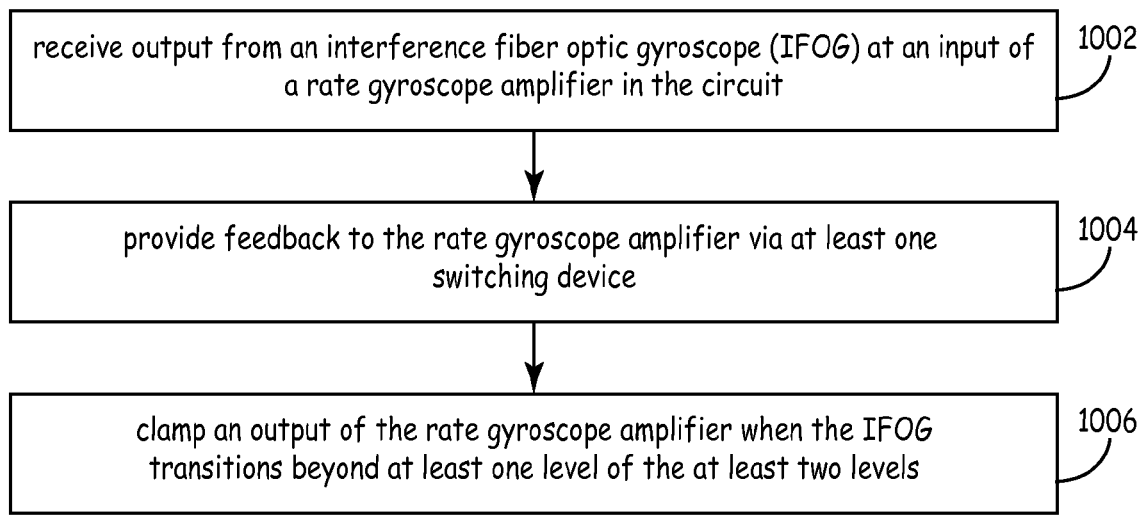

FIG. 9 is a flow diagram representative of a method of extending an operating range and improving a linearity of an output of a circuit in accordance with the present invention; and FIG. 10 is a flow diagram representative of a method of extending an operating range and improving a linearity of an output of a circuit receiving input from an interferometric fiber optic gyroscope in accordance with the present invention.

In accordance with common practice, the various described features are not drawn to scale but are drawn to emphasize features relevant to the present invention. Like reference characters denote like elements throughout figures and text.

DETAILED DESCRIPTION

Embodiments of clamping circuits in a signal processing path are described herein. These clamping circuits allow for use of extended gain in FOG or interferometric fiber optic gyroscope (IFOG) signal processing without distortion of voltage waveforms that are otherwise within the safe operating range of the electronic components. Circuitry is used to clamp input voltages to vulnerable electronic components to a safe operating range (below the voltage damage threshold or other desirable threshold $V_d$). The desirable threshold $V_d$ is a maximum safe voltage or a maximum level of the desired operating range. An ideal clamping circuit is able to: 1) pass, without distortion, voltages within some selected clamping range $V_c$ that is limited to a desired clamp level such that $V_c \leq V_d$; and 2) prevent or limit voltage excursions above the voltage damage threshold or other desirable threshold $V_d$ to the selected clamping range. The selected clamping range is greater than or equal to the normal operating voltage range. The normal operating voltage range is also referred to herein as the "normal gyro operating range $V_{gor}$".

There may be other criteria for selecting the desired clamp level $V_c$ (also referred to herein as a clamp voltage $V_c$ or a fixed level $V_c$), beyond considerations of an ADC damage threshold described above. For example it may be desirable to ensure that an operational amplifier never saturates; although saturation may present no damage risk to the op-amp, it can nevertheless lead to performance degradation in the form of very long and unpredictable recovery times after each saturation event. In this case, it may be desirable to design the clamping circuit such that desired clamp level $V_c < V_s$, where $V_s$ is the saturation level of the op-amplifier, and $V_c$ is the clamp level of the circuit. It is to be understood that the specific value of the clamp level $V_c$ can vary with different applications.

Figure 1A:
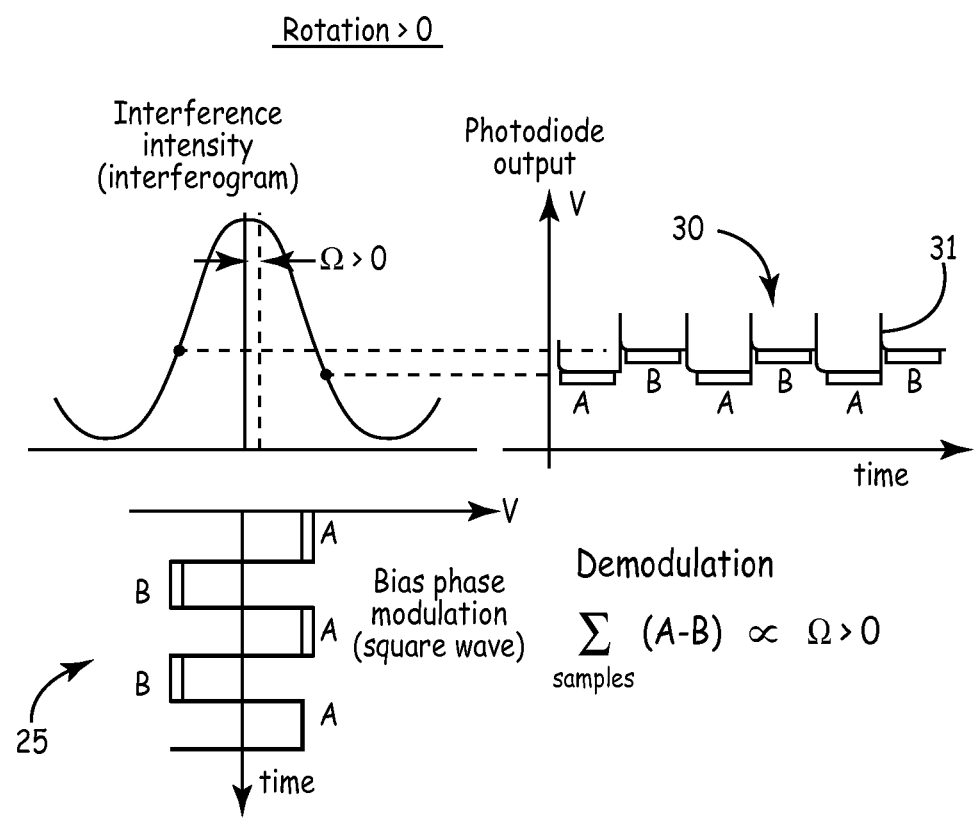
FIG. 1A shows photodiode output of a an interferometric fiber optic gyroscope (IFOG) with square-wave modulation during normal operation.

FIG. 1A shows photodiode output of an interferometric fiber optic gyroscope (IFOG) with square-wave modulation during normal operation. As defined herein, "normal operation of an interferometric fiber optic gyroscope" is operation of the IFOG when no transient events are being experienced by the IFOG. In normal operation of an IFOG with square-wave modulation, as shown by modulation waveform 25, the photodetector output is essentially a square wave, shown as output waveform 30, with very short spikes 31 or glitches 31 at each transition of the square wave. The term "photodiode output" refers either directly to the photocurrent output of the photodiode or to the voltage output of a transimpedance amplifier which converts photocurrent to voltage. The alternating square wave phases are labeled A and B. The transition from level A to level B is referred to herein as a "transitioning event" and a "linear transitioning event". The linear transitioning events from level A to level B or from level B to level A are referred to herein as "normal transitions" and do not require clamping. The difference signal (A–B), typically obtained by square-wave demodulation, is greater than zero if the gyroscope is rotating (spinning) in one direction and the difference signal (A–B) is less than zero the gyroscope is rotating (spinning) in the other (opposite) direction. A 'closed-loop' IFOG circuit nulls out this A–B difference signal by providing phase correction to the light beams. The amount of correction required to null the signal is proportional to the rate that the coil (gyro) is spinning.

For IFOG applications, linear A and B signals are critical to obtaining a correct spin rate value. If the response is not linear, there are errors in the performance of the IFOG rate measurement. A high-performance IFOG rate amplifier must demonstrate linearity for both the A and the B signals to measure rotation rate accurately. When slewing from the A phase to the B phase of bias modulation, the electronics rapidly moves the operating point over the maximum output of the gyroscope (the peak of the interferogram), and at this point a spike in optical power is generated (e.g., spike 31).

The square wave of the photodetector waveform 30 is normally of very low amplitude. In one implementation of this embodiment, the amplitude is zero for null rotation rate in an open-loop gyroscope or for null acceleration in a closed-loop gyroscope. For some rotation rates and/or acceleration conditions, the amplitude of the square wave approaches the desired clamp level $V_c$. In this case, it is important that the clamp circuit not distort the generally square shape of the photodetector waveform 30 for any voltage $V \leq V_c$. Stated another way, it is important that the clamp output be linear in the square wave input voltage (i.e., the square-wave modulation waveform 25), as long as the input voltage is less than or equal to the desired clamp level $V_c$. Such clamping linearity is needed to ensure good scale factor linearity of the gyroscope.

Figure 1B:
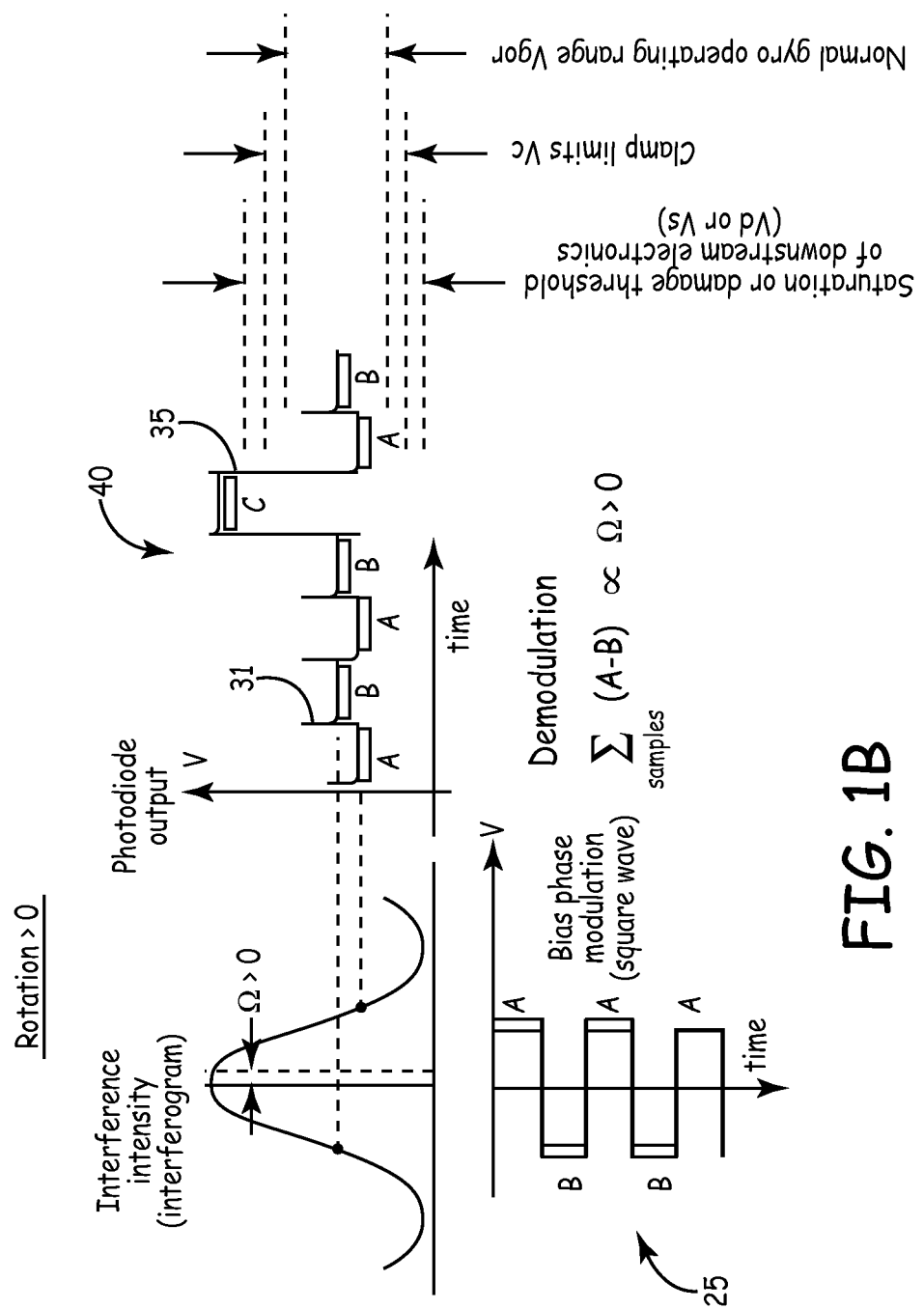
FIG. 1B shows operation of a closed loop interferometric fiber optic gyroscope (IFOG) with square-wave modulation during a transient event.

The circuits described herein are designed to provide an increased operating range of the signal processing electronics, to provide high linearity in this desired operating range, and to rapidly clamp beyond the operating range even in the event of transient events. FIG. 1B shows an operation of an interferometric fiber optic gyroscope (IFOG) with a square-wave modulation during a transient event. A transient event generates a pulse 35 in the photodetector waveform 40 that exceeds the desired clamp level $V_c$ and exceeds the saturation damage threshold ($V_s$ or $V_d$) of downstream electronics. The transition from level A or level B to the exemplary level C is referred to herein as a "transient event". Transient events from level A to the level C or from level B to level C are generally infrequent events that would, in the absence of clamping, push the signal level beyond the saturation or damage threshold of downstream electronics. The transient events are clamped to the selected desired clamp level $V_c \leq V_d$ (e.g., the defined range) by the circuits described herein.

In order to clearly outline the advantages of the circuits described herein, the effects of ideal and non-ideal clamping are described. FIGS. 2A-2F show exemplary ideal and non-ideal clamping. FIGS. 2A-2B show ideal clamping for $V_{in}$ and $V_{out}$, respectively. An exemplary input voltage pulse $V_{in}$ shown in FIG. 2A is clamped as an exemplary output voltage pulse $V_{out}$ shown in FIG. 2B to a maximum desired clamp level $V_c$. The output voltage pulse $V_{out}$ is flat. The voltage of an exemplary gyroscope operating range $V_{gor}$ is shown to be slightly less than the clamp voltage $V_c$. In this ideal case, any input voltage within the gyroscope operating range $V_{gor}$ is unaffected by the clamping circuit, and the ratio of $V_{out}/V_{in}$ (shown in FIG. 2E) is constant and equal to unity (1.0) throughout the gyroscope operating range $V_{gor}$ and up to the clamp voltage $V_c$.

FIGS. 2C-2D show non-ideal clamping. The exemplary input voltage pulse $V_{in}$ shown in FIG. 2C is clamped as a non-ideal exemplary output voltage pulse $V_{out}$ (FIG. 2D) with distortion at voltages less than or equal to the clamp voltage $V_c$. In this non-ideal case, the exemplary output voltage pulse $V_{out}$ is a poor representation of $V_{in}$ because of the non-ideal clamping. As shown in FIG. 2D, portions of the output voltage $V_{out}$ differ from $V_{in}$ even where $V_{in}$ is within the gyroscope operating range $V_{gor}$. As shown in FIG. 2F, for the non-ideal case, the ratio of $V_{out}/V_{in}$ is less than one (1) within the gyroscope operating range $V_{gor}$. The gyroscope signal is corrupted when the ratio of $V_{out}/V_{in}$ is less than one (1) within the gyroscope operating range $V_{gor}$.

Transient events mandate the need for a clamping circuit. An overshoot spike may periodically occur in fiber optic gyroscopes due to dead band suppression in which randomizing modulation schemes are used. Randomizing modulation schemes generate a photodetector waveform that is periodically modulated with a square pulse (typically on the order of microseconds in duration) of random amplitude and direction. With high gain in the signal processing electronics, such pulses may be amplified well above the voltage saturation or damage thresholds $V_s$ or $V_d$. A clamping circuit is needed to prevent damage or saturation.

Other transient events are radiation events and mechanical shock. In a radiation event, the photodetector is briefly flooded with photocurrent, potentially creating a voltage spike above the upper limit of the voltage saturation or damage thresholds $V_s$ or $V_d$. Similarly, mechanical shock may create a rapid optical loss transient, driving the voltage near a lower voltage saturation or damage threshold $V_s$ or $V_d$. These transient events cause a fast temporary decrease or increase in optical power, and typically reduce the rate measurement accuracy of an IFOG. The large optical transitions or glitches that reduce rate measurement accuracy of the IFOG are referred to herein as "large gyroscope rate events". The embodiments of circuits described herein increase linearity in the normal operating range and reduce harmonic distortion during the clamping process.

The gyroscope firmware may be configured to reject the glitches or spikes by skipping acquisition samples during the transition event. However, distortion created by the clamping circuitry may allow glitch noise to extend beyond the transition event and corrupt the gyroscope signal.

The circuits described herein are applicable to applications that require a linear output from an amplifier, which receives signals from a device transitioning between two or more levels. The circuits described herein create a linear operating range (i.e., a low differential gain error) over an extended dynamic range and reduce the probability of the rate amplifier going non-linear at the extremity of operating range.

The circuits described herein use an active switching device, such as, a bipolar-junction transistor (BJT), to provide an improved linear transfer function up to a desired clamping level (i.e., clamping function). The circuits described herein are designed to include the desired operating range as required or desired by a user of the circuit. As defined herein, an "improved linear transfer function" output from the circuit is an improvement of the transfer function output from a prior art clamping circuit.

Figure 3:
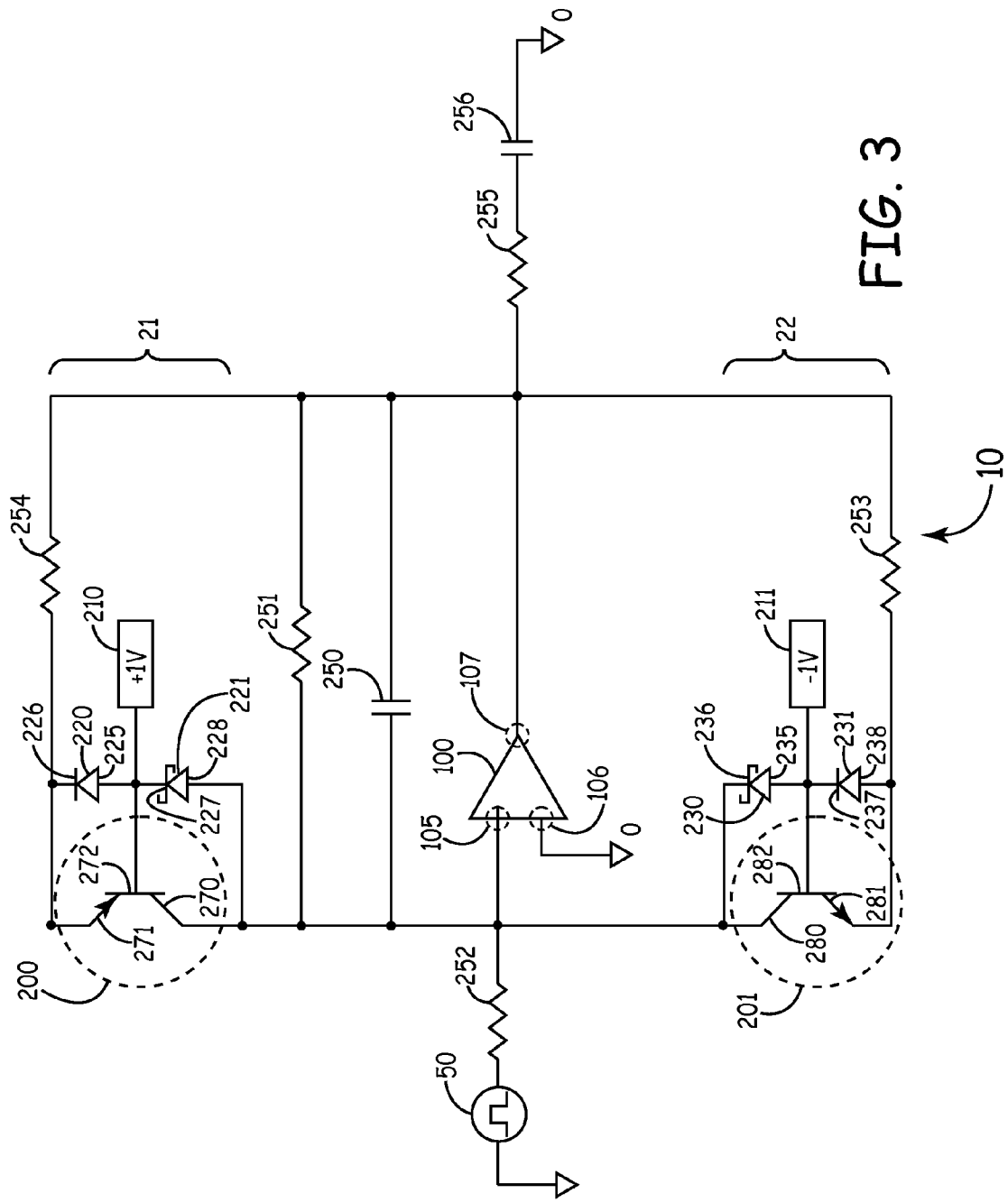
FIG. 3 shows an embodiment of a clamp-point active circuit in accordance with the present invention.

FIG. 3 shows an embodiment of a clamp-point active circuit 10 in accordance with the present invention. The clamp-point active circuit 10 is also referred to herein as circuit 10.

Circuit 10 includes a rate amplifier 100, a PNP bipolar junction transistor 200 (also referred to herein as "active switching device 200" and "switching device 200"), an NPN bipolar junction transistor 201(also referred to herein as "active switching device 201" or "switching device 201"), a positive voltage source 210, a first diode 220, a second diode 221, a negative voltage source 211, a third diode 230, and a fourth diode 231. The inverting input 105 of the rate amplifier 100 receives pulses via an input resistor 252 from a device 50. The non-inverting input 106 of the rate amplifier 100 is connected to a grounded line. An output resistor 255 and an output capacitor 256 are arranged in series to receive output signals from the output 107 of the rate amplifier 100. The output signals are provided to back end gyroscope processing circuits (not shown) as required by the type of technical application provided by the device 50.

Figure 8:
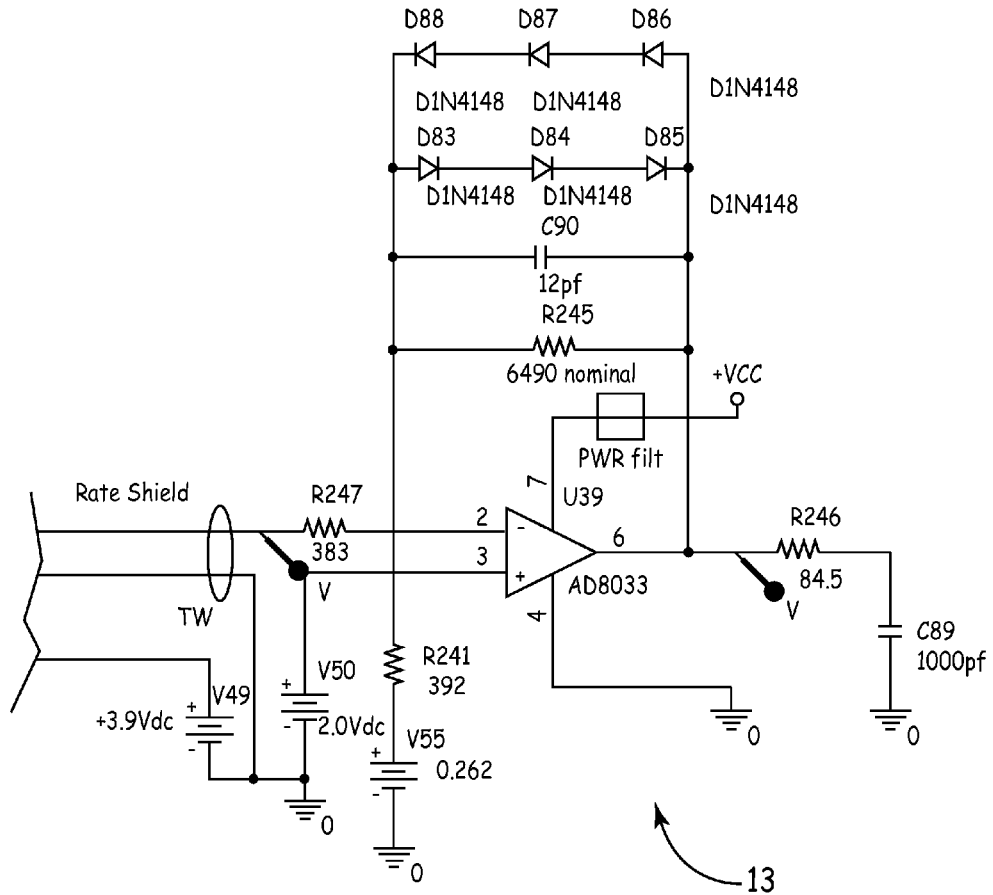
FIG. 8 shows a prior art clamping circuit.

The rate amplifier 100 receives output from the device 50 that is switching between two levels. In one implementation of this embodiment, the device 50 is a rate photodetector of an interferometric fiber optic gyroscope. In such an embodiment, the rate amplifier 100 is a rate gyroscope amplifier 100. Therefore, the terms "rate amplifier" and "rate gyroscope amplifier" are used interchangeably herein. The PNP bipolar-junction transistor 200 and the NPN bipolar junction transistor 201 are in respective feedback loops of the rate gyroscope amplifier 100. PNP bipolar junction transistor 200 and the NPN bipolar junction transistor 201 receive an output from the rate gyroscope amplifier 100. The bipolar-junction transistor switching action in the circuit 10 causes the rate gyroscope amplifier 100 to output signals having a transfer function within the desired operating range that is more linear than signals output from an amplifier in a prior art clamping circuit, which does not include the bipolar junction transistor switching action of the circuit 10. An exemplary prior art clamping circuit is shown in FIG. 8.

Circuit 10 uses the two bipolar junction transistors 200 and 201 and four diodes 220, 221, 230, and 231 in a symmetrical fashion. The PNP bipolar junction transistor 200, the first diode 220, and the second diode 221 form a first-half circuit 21. The PNP bipolar junction transistor 200 provides a low-impedance feedback path from the output 107 of the rate gyroscope amplifier 100 to the inverting input 105 of the rate gyroscope amplifier 100 when the output 107 of the rate gyroscope amplifier 100 exceeds a preselected voltage. In one implementation of this embodiment, the preselected voltage is $1V+V_{BE}$ (about +1.6V), where $V_{BE}$ is the base-emitter voltage of the transistor. First diode 220 (also referred to herein as PN diode 220) protects the PNP bipolar junction transistor 200 base-emitter junction from damaging reverse-voltage breakdown. Second diode 221 (also referred to herein as Schottky diode 221) prevents collector/emitter (CE) saturation of the PNP bipolar junction transistor 200 and improves operating speed.

Similar actions occur in the second-half circuit 22 that includes the NPN bipolar junction transistor 201, the fourth diode 231 (also referred to herein as PN diode 231), and third diode 230 (also referred to herein as Schottky diode 230). Here, the NPN bipolar junction transistor 201 provides a low-impedance feedback path from the output 107 of the rate gyroscope amplifier 100 to the inverting input 105 of the rate gyroscope amplifier 100 when the output of the rate gyroscope amplifier 100 drops below the negative of the preselected value. In one implementation of this embodiment, the negative of the preselected voltage is $-1V-V_{BE}$ (about −1.6V). Fourth diode 231 protects the NPN bipolar junction transistor 201 base-emitter junction from damaging reverse-voltage breakdown. The third diode prevents collector/emitter (CE) saturation of the NPN bipolar junction transistor 201 and improves operating speed. The first-half circuit 21 and the second-half circuit 22 together provide high linearity in the operating range, a maximum operating range, and rapid clamping beyond the operating range.

An output of the positive voltage source 210, an anode 225 of the first diode 220, and a cathode 227 of the second diode 221 are connected to a base 272 of the PNP bipolar junction transistor 200. As defined herein, a connection between two circuit elements is either a direct connection between the elements or a connection between the elements made via another circuit element (for example, a resistor or an inductor). In one implementation of this embodiment, the connections are trace lines on a circuit board. A collector 270 of the PNP bipolar junction transistor 200 is connected to the inverting input 105 of the rate gyroscope amplifier 100. An anode 228 of the second diode 221 is connected to the collector 270 of the PNP bipolar junction transistor 200 and to the inverting input 105 of the rate gyroscope amplifier 100. A cathode 226 of the first diode 220 is connected to the output 107 of the rate gyroscope amplifier 100 through resistor 254 and is also connected to the emitter 271 of the PNP bipolar junction transistor 200. The emitter 271 of the PNP bipolar junction transistor 200 is connected to the output 107 of the rate gyroscope amplifier 100 through resistor 254.

An output of the negative voltage source 211, an anode 235 of the third diode 230, and a cathode 237 of the fourth diode 231 are connected to a base 282 of the NPN bipolar junction transistor 201. A collector 280 of the NPN bipolar junction transistor 201 is connected to the inverting input 105 of the rate gyroscope amplifier 100. A cathode 236 of the third diode 230 is connected to the collector 280 of the NPN bipolar junction transistor 201 and to the inverting input 105 of the rate gyroscope amplifier 100. An anode 238 of the fourth diode 231 is connected to the output 107 of the rate gyroscope amplifier 100 through resistor 253 and is also connected to the emitter 281 of the NPN bipolar junction transistor 201. The emitter 281 of the NPN bipolar junction transistor 201 is connected to the output 107 of the rate gyroscope amplifier 100 through resistor 253.

A feedback resistor 251 and a feedback capacitor 250 are configured in parallel to the rate gyroscope amplifier 100. The feedback resistor 251 and feedback capacitor 250 are connected from the output 107 of the rate gyroscope amplifier 100 to the inverting input 105 of the rate gyroscope amplifier 100. In this manner, feedback is provided to the rate gyroscope amplifier 100. The clamping range of the clamp-point active circuit 10 is easily adjusted by replacing the precision voltage sources 210 and 211 with precision voltage sources 210 and 211 of different values. In one implementation of this embodiment, the precision voltage sources 210 and 211 are tunable voltage sources and the clamping range of the clamp-point active circuit 10 is adjusted by tuning the precision voltage sources 210 and 211.

The switching of the switching devices 200 and 201 extends the linear operating range of circuit 10 and simultaneously ensures greatest probability of clamping transient events that could otherwise exceed the operating range. The switching of the switching devices 200 and 201 in circuit 10 of FIG. 3 causes the rate amplifier 100 to amplify with high linearity in a desired operating range and to clamp the transient events received from the transitioning device 50 that are outside the desired operating range (e.g., greater than $V_d$) to a fixed level $V_c$. The rate amplifier 100 is clamped when the device 50 transitions beyond at least one level (e.g., beyond level B to level C of FIG. 1B) of the at least two levels. Circuit 10 is designed with selected elements to maximize the percent of clamped transient events over the extended operating range.

In one implementation of this embodiment, the percentage of clamped transient events is increased (improved) to 99.99%. In another implementation of this embodiment, the percentage of clamped transient events is increased to 99.99%. In yet another implementation, the percentage of clamped transient events is increased to 99.999%. Circuit 10 is designed with selected elements to ensure the desired percentage of clamped transient events over the extended operating range. In yet another implementation of this embodiment, the percentage of clamped transient events is maximized over the extended operating range.

In one implementation of this embodiment, the first diode 220 is diode 1N4148, the second diode 221 is diode 1N5711, the PNP bipolar junction transistor 200 is a transistor 2N2907A, the third diode 230 is diode 1N5711, the fourth diode 231 is diode 1N4148, and the NPN bipolar junction transistor 201 is transistor 2N2222A. In another implementation of this embodiment, the feedback resistor 251 is a 6000 ohm resistor, the feedback capacitor 250 is a 4 pF capacitor, resistor 254 is a 200 ohm resistor, and the resistor 253 is a 200 ohm resistor. In this embodiment, the input resistor 252 is a 2000 ohm resistor, the output resistor 255 is an 84.5 ohm resistor, and the output capacitor 256 is a 1 pF capacitor. In another implementation of this embodiment, the circuit 10 includes other diodes and transistors and other values for the resistors and capacitors.

Figure 4A:
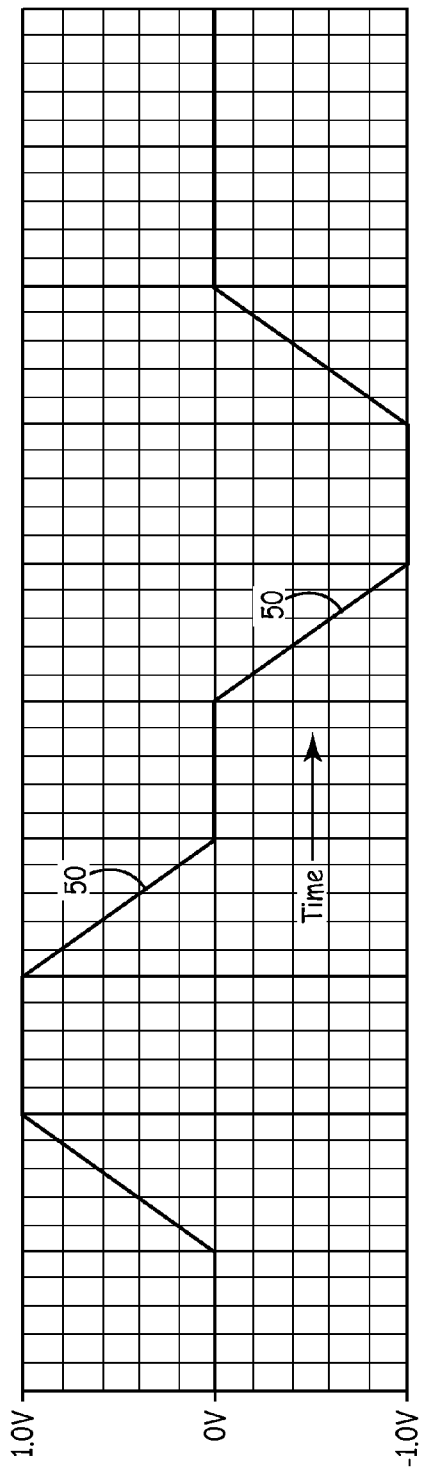
FIG. 4A shows a simulated piece-wise linear input waveform.
Figure 4B:
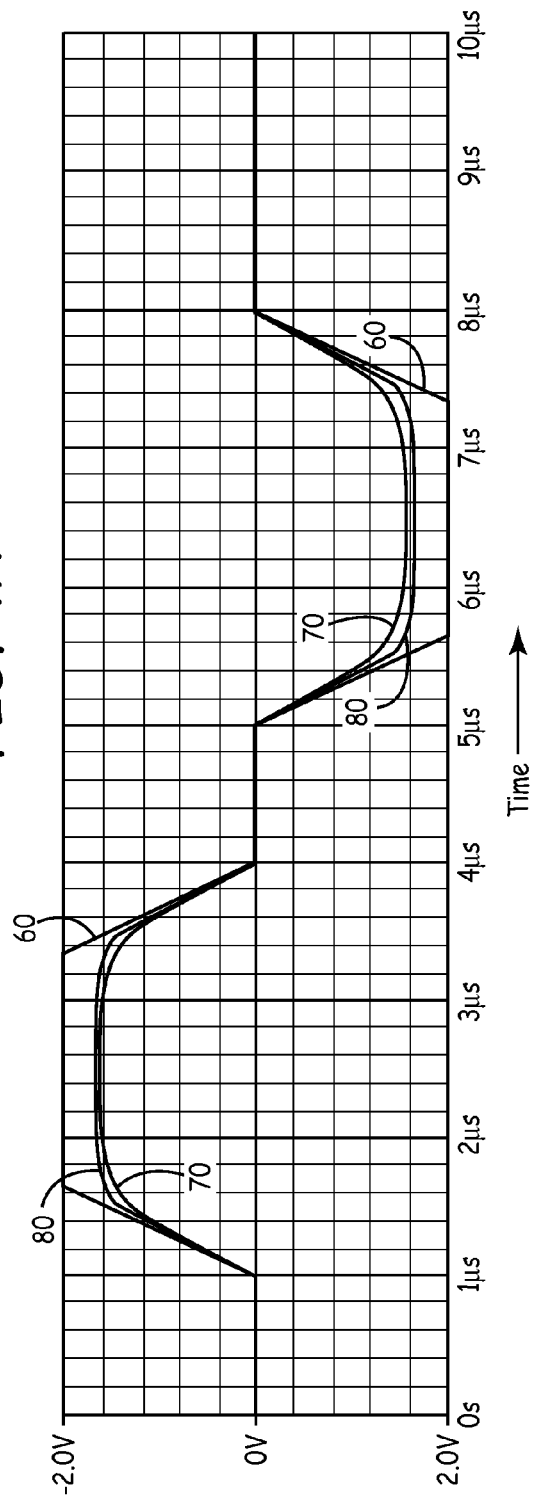
FIG. 4B shows simulated output waveforms responsive to the input waveform of FIG. 4A being input to an ideal linear circuit, a prior art clamping circuit, and the circuit of FIG. 1.

FIG. 4A shows a simulated piece-wise linear input waveform 50. FIG. 4B shows simulated output waveforms 60, 70, and 80 responsive to the input waveform 50 of FIG. 4A being input to an ideal linear circuit, a prior art clamping circuit, and the circuit 10 of FIG. 3, respectively. The output waveform 60 in FIG. 4B shows the pure linear output (for comparison before the breakpoint). The output waveform 70, which is superimposed on the output waveform 60, shows the output from an exemplary non-ideal prior art clamping circuit (see FIG. 8) that lacks the bipolar-junction transistor switching action in the circuit. The output waveform 80, which is superimposed on the output waveforms 60 and 70, shows the output from the circuit 10 (FIG. 3), which is more linear than the output waveform 70 from the prior art circuit. Since the output waveform 80 is more linear than the prior art output waveform 70, the operating range of the output waveform 80 is extended beyond the operating range of the prior art output waveform 70. Ideally, the output waveform 80 has an ideal slew rate near 3 volts/microsecond before the break-point. This operation supports IFOG A-B integration for accurate rate determination at rates scaled below the break-point, by design. Thus, circuit 10 of FIG. 3 provides a clamp-point that clamps higher than a prior art clamping circuit and reduces distortion for the statistical ensemble of gyroscope optical transition events.

An acceptably linear function is a function that varies from the ideal by less than some defined threshold, possibly 100 parts per million (ppm); in other words, the circuit is highly linear if $V_{out}/V_{in}$ equals 1.0 to within 100 ppm. In accordance with another definition herein, a highly linear function is a function that varies from the ideal by less than 10 ppm. In accordance with one definition herein, the region where clamping occurs is considered to be highly linear when the region in which clamping occurs includes oscillations (ringing) of less than 1% of the clamp voltage $V_c$ for less than 5% of the initial time of the whole time that the clamping occurs. In accordance with one definition herein, the region where clamping occurs is considered to be highly linear when the region in which clamping occurs includes oscillations (ringing) of less than 3% of the clamp voltage $V_c$ for less than 10% of the initial time of the whole time that the clamping occurs. In accordance with one definition herein, the transfer function is highly linear when the region where clamping occurs includes oscillations (ringing) of less than 1% of the clamp voltage $V_c$ rather than ringing of 10% of the clamp voltage $V_c$ available from a prior art clamping circuit. In accordance with one definition herein, the linearity of the transfer function is improved so that ringing occurs for less than 5% the whole time that the clamping occurs rather than the ringing in a prior art clamping circuit that occurs for 20% of the whole time that the clamping occurs.

Other embodiments of clamping circuits do not require voltages or networks that are external to the rate feedback network. These embodiments may reduce random and systematic noise levels over circuits that require external sources/circuits, since voltages or networks (including circuit elements) external to the rate feedback network can introduce extra noise to the circuit. The embodiments of clamping circuits that do not require voltages or networks external to the rate feedback network circuits are significantly faster at engaging/disengaging the clamping function than prior art clamping circuits. Advantageously, such circuits produce scale factor linearity performance that is better than the prior art clamping circuits over temperature or other environmental variations. An ideal rate amplifier behaves linearly over amplitude and temperature, and clamps but does not saturate under the operating conditions described.

Figure 5:
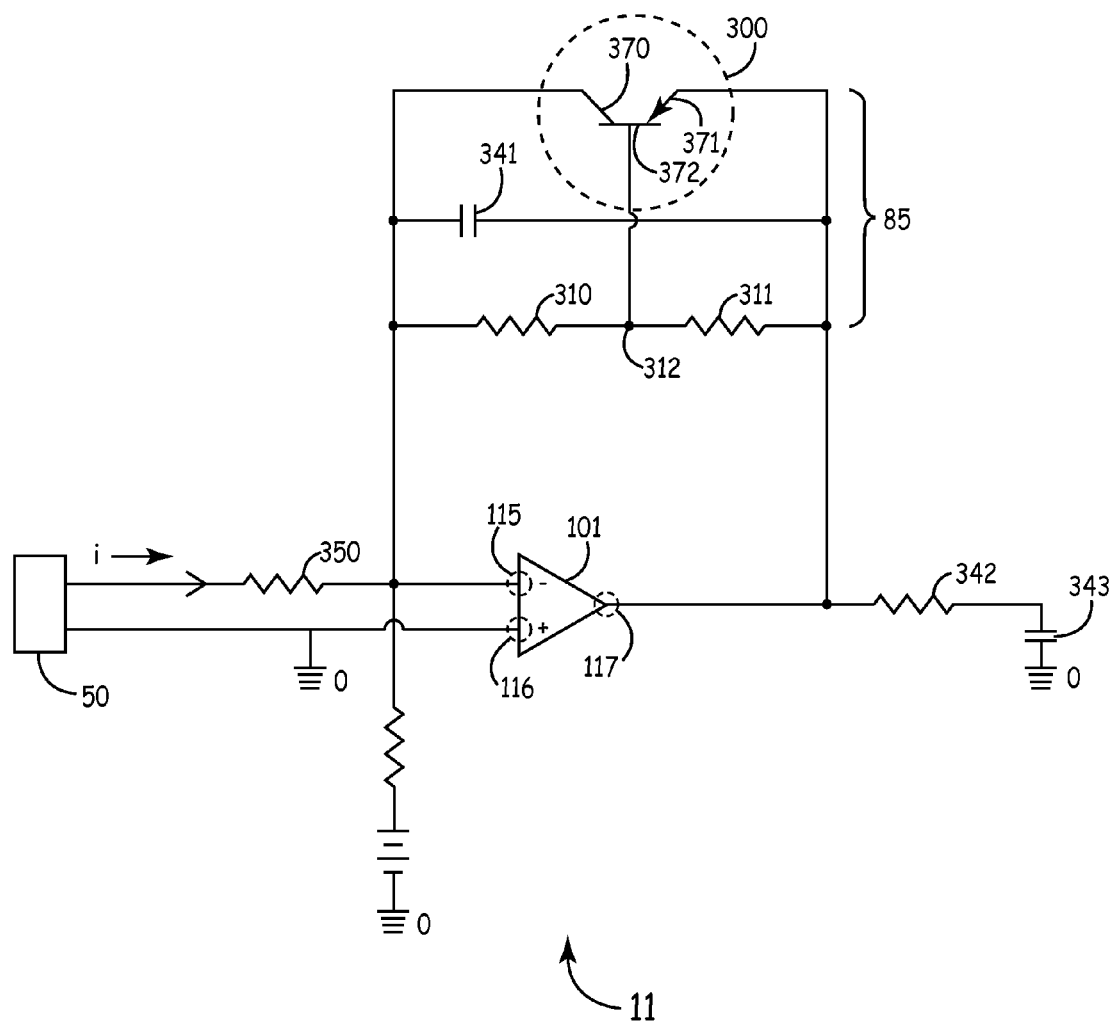
FIGS. 5 and 6 show embodiments of clamp-point active circuits in accordance with the present invention.

FIG. 5 shows an embodiment of a clamp-point active circuit 11 in accordance with the present invention. The clamp-point active circuit 11 is also referred to herein as circuit 11. Circuit 11 includes rate amplifier 101, a PNP bipolar junction transistor 300 (also referred to herein as "active switching device 300" and "switching device 300"), a first resistor 310, a second resistor 311, and a feedback capacitor 341. The rate amplifier 101, the PNP bipolar junction transistor 300, the first resistor 310, and the second resistor 311 together form a rate feedback network 85 to the rate gyroscope amplifier 101. The circuit 11 also includes an input resistor 350, an output resistor 342, and an output capacitor 343. The inverting input 115 of the rate amplifier 101 receives current via the input resistor 350. The non-inverting input 116 of the rate amplifier 101 is grounded.

The rate amplifier 101 receives output from a device 50 that is switching between two levels. In one implementation of this embodiment, the device 50 is a rate photodetector of an interferometric fiber optic gyroscope. In this case, the rate amplifier 101 is a rate gyroscope amplifier 101. The PNP bipolar junction transistor 300 is in a feedback loop of the rate gyroscope amplifier 101. PNP bipolar junction transistor 300 receives an output from the rate gyroscope amplifier 101. A bipolar junction transistor switching action in the circuit 11 gives the rate gyroscope amplifier 101 a transfer function with improved linearity in the normal operating voltage range and improved clamping above this range.

An emitter 371 of the PNP bipolar junction transistor 300 is connected to the output 117 of the rate gyroscope amplifier 101. A collector 370 of the PNP bipolar junction transistor 300 is connected to the inverting input 115 of the rate gyroscope amplifier 101. A base 372 of the PNP bipolar junction transistor 300 is connected to a node 312 between the first resistor 310 and the second resistor 311 in series with each other. The first resistor 310 and the second resistor 311 are in parallel to inverting input 115 and the output 117 of the rate gyroscope amplifier 101. The feedback capacitor 341 is also in parallel to the inverting input 115 and the output 117 of the rate gyroscope amplifier 101. The clamping range of the clamp-point active circuit 11 is easily adjusted by replacing the resistor 311 with a resistor 311 of another value.

In one implementation of this embodiment, the PNP bipolar junction transistor 300 is a MM3906 transistor, the feedback resistor 310 is a 3,650 ohm resistor, the feedback resistor 311 is a 665 ohm resistor, the feedback capacitor 341 is an 18 pF capacitor, resistor 342 is a 169 ohm resistor, and the resistor 350 is a 383 ohm resistor. In another implementation of this embodiment, the circuit 11 includes another transistor and other values for the resistors and capacitors.

The switching of the switching device 300 in circuit 11 of FIG. 5 extends the linear operating range of circuit 11 and simultaneously ensures greatest probability of clamping transient events that could otherwise exceed the operating range. The switching of the switching device 300 causes the rate amplifier 101 to amplify with high linearity in a desired operating range and to clamp transient events received from the transitioning device 50 that are outside the desired operating range to a fixed level (clamp voltage) $V_c$. The rate amplifier 101 is clamped when the device 50 transitions beyond at least one level (e.g., beyond level B to level C of FIG. 1B) of the at least two levels A and B (FIG. 1B). Circuit 11 is designed with selected elements to maximize the percent of clamped transient events over the extended operating range.

Figure 6:
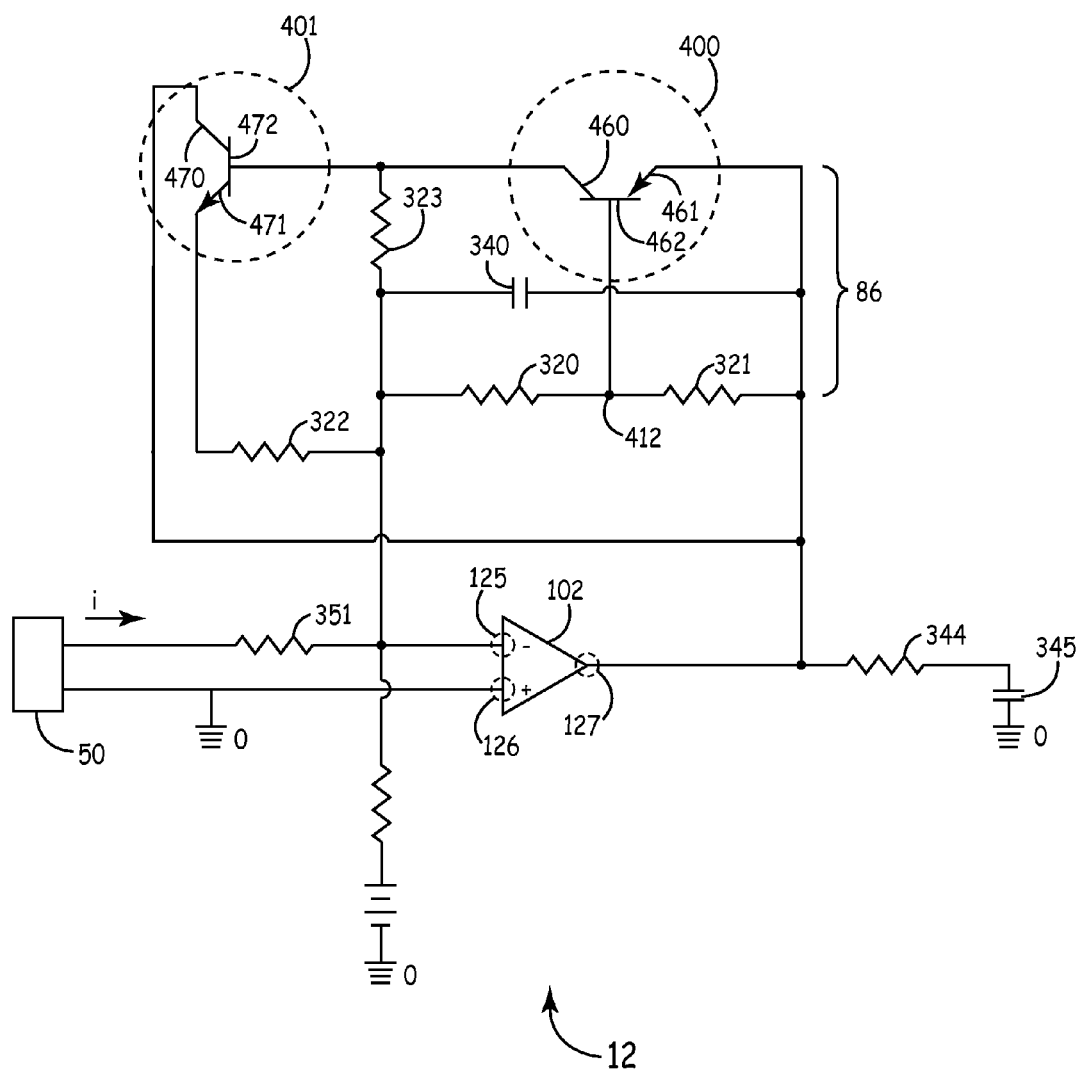

FIG. 6 shows an embodiment of a clamp-point active circuit 12 in accordance with the present invention. The clamp-point active circuit 12 is also referred to herein as "circuit 12" and "cascode circuit 12". Circuit 12 includes a rate amplifier 102, a PNP bipolar junction transistor 400 (also referred to herein as "active switching device 400" and "switching device 400"), an NPN bipolar junction transistor 401 (also referred to herein as "active switching device 401" and "switching device 401"), a first resistor 320, a second resistor 321, a feedback capacitor 340, a resistor 323, and a resistor 322. The rate amplifier 102, the PNP bipolar junction transistor 400, the NPN bipolar junction transistor 401, the first resistor 320, the second resistor 321, the feedback capacitor 340, and the resistors 323 and 322 together form a rate feedback network 86 to the rate gyroscope amplifier 102. Circuit 12 also includes an input resistor 351, an output resistor 344, and an output capacitor 345. The inverting input 125 of the rate amplifier 102 receives current through the input resistor 351. The non-inverting input 126 of the rate amplifier 102 is connected to a grounded line.

The rate amplifier 102 receives output from a device 50 that is switching between at least two levels (e.g., levels A and B). In one implementation of this embodiment, the device 50 is a rate photodetector of an interferometric fiber optic gyroscope and the rate amplifier 102 is a rate gyroscope amplifier 102. The PNP bipolar junction transistor 400 and the NPN bipolar junction transistor 401 are in a feedback loop of the rate gyroscope amplifier 102. A bipolar-junction transistor switching action in the circuit 12 causes the rate gyroscope amplifier 102 to output an improved transfer function.

An emitter 461 of the PNP bipolar junction transistor 400 is connected to the output 127 of the rate gyroscope amplifier 102. A collector 460 of the PNP bipolar junction transistor 400 is connected to an inverting input 125 of the rate gyroscope amplifier 102 through a resistor 323. A base 462 of the PNP bipolar junction transistor 400 is connected to a node 412 between a first resistor 320 and a second resistor 321 in series with each other. The first resistor 320 and the second resistor 321 are in parallel to the inverting input 125 and the output 127 of the rate gyroscope amplifier 102. A feedback capacitor 340 is also in parallel to the inverting input 125 and the output 127 of the rate gyroscope amplifier 102.

An emitter 471 of the NPN bipolar junction transistor 401 is connected via a resistor 322 to the inverting input 125 of the rate gyroscope amplifier 102. A collector 470 of the NPN bipolar junction transistor 401 is connected to the output 127 of the rate gyroscope amplifier 102. A base 472 of the NPN bipolar junction transistor 401 is connected via the resistor 323 to the inverting input 125 of the rate gyroscope amplifier 102. The base 472 is also connected to the collector 460 of the PNP bipolar junction transistor 400. The clamping range of the clamp-point active circuit 11 is easily adjusted by replacing the resistor 321 with a resistor 321 of another value.

Circuit 12 is a cascode circuit 12 which permits fast, highly linear response. The circuits 11 or 12 are independent of voltages external to the rate feedback network 85 or 86, respectively, and thus independent of the extra noise generated by external voltages.

In one implementation of this embodiment, the PNP bipolar junction transistor 400 is a transistor MM3906, the NPN bipolar junction transistor 401 is a transistor MPS2222, the feedback resistor 320 is a 3711 ohm resistor, the feedback resistor 321 is a 604 ohm resistor, the feedback capacitor 340 is a 7 pF capacitor, resistor 323 is a 10K ohm resistor, and the resistor 322 is a 1 ohm resistor. In another implementation of this embodiment, the input resistor 351 is a 383 ohm resistor and the output resistor 344 is a 169 ohm resistor. In another implementation of this embodiment, the circuit 12 includes other transistors and other values for the resistors and capacitors.

The switching of the switching devices 400 and 401 in circuit 12 of FIG. 6 extends the linear operating range of circuit 12 and simultaneously ensures greatest probability of clamping transient events that could otherwise exceed the operating range. The switching of the switching devices 400 and 401 causes the rate amplifier 102 to amplify with high linearity in the desired operating range and to clamp transient events received from the transitioning device 50 that are outside the desired operating range to a fixed level (clamp voltage) $V_c$. The rate amplifier 102 is clamped when the device 50 transitions beyond at least one level (e.g., beyond level B to level C of FIG. 1B) of the at least two levels A and B (FIG. 1B). Circuit 12 is designed with selected elements to maximize the percent of clamped transient events over the extended operating range.

Figure 7:
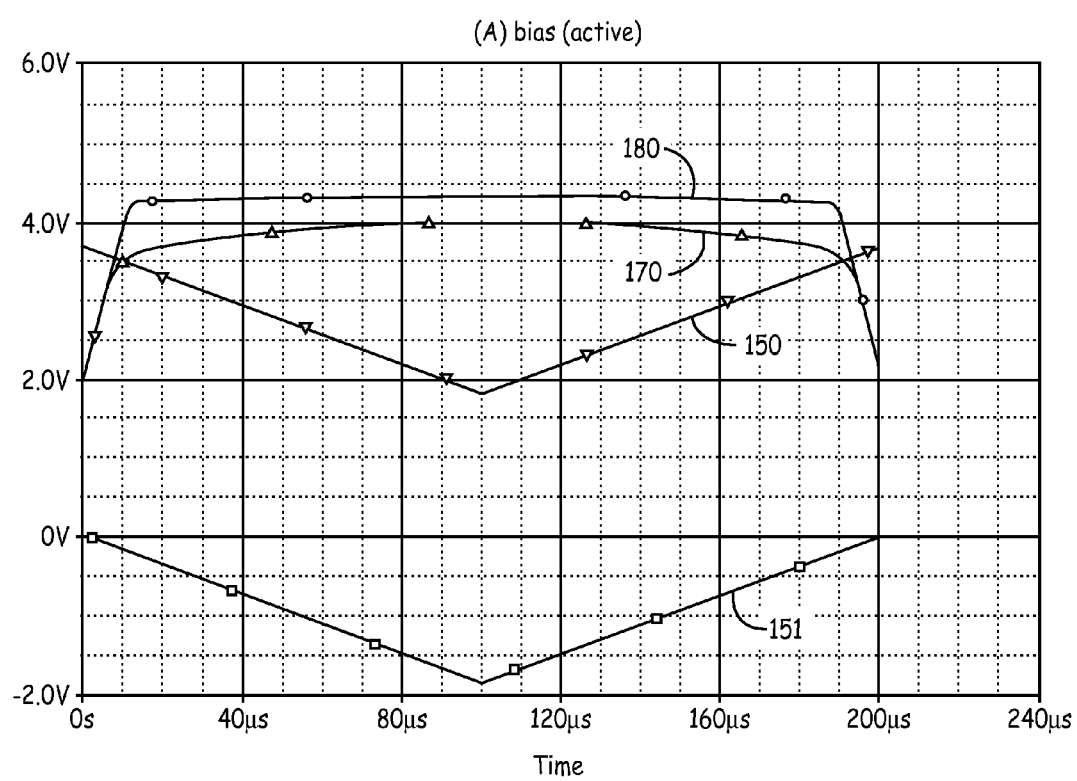
FIG. 7 shows simulated output waveforms responsive to an input triangle waveform being input to a prior art clamping circuit and the circuit of FIG. 6.

FIG. 7 shows simulated output waveforms 170 and 180 responsive to an input triangle waveform 150 being input to a prior art clamping circuit 13, and the circuit 12 of FIG. 6. FIG. 8 shows a prior art clamping circuit 13.

The input waveform 150 in FIG. 7 shows the pure linear input. The triangle waveform 151 is the DC offset difference removed from the output waveform 150 by offset circuitry at the inverting input node 125 of the rate amplifier 102 of circuit 12 (FIG. 6). The output waveform 170 shows the output from an exemplary non-ideal prior art clamping circuit 13 (FIG. 9) that lacks the bipolar junction transistor switching action in the circuit. The output waveform 180 shows the output from the cascode circuit 12 (FIG. 6).

The linearity and distortion performance of circuit 11 is better than that of the prior art clamping circuit 13 (FIG. 8), but that is less than that of cascode circuit 12. Circuit 11 advantageously requires fewer components to provide high linearity. The linearity and distortion performance of circuit 12 is very high, however circuit 12 requires more than twice the components required in circuit 11. The bipolar junction transistor switching action clamps the output of the rate gyroscope amplifiers 100, 101, and 102 in the circuits 10, 11, and 12, respectively, to the desired clamp level $V_c \leq V_d$ while providing a transfer function that is more linear in the normal operating voltage range $V_{gor}$. The bipolar junction transistor switching action in the circuits 10, 11, and 12 causes the rate gyroscope amplifiers 100, 101, and 102, respectively, to output signals below the desired clamp level $V_c$ with a transfer function that is more linear than signals output from an amplifier without the bipolar junction transistor switching action of the circuits 10, 11, or 12. In embodiments, the circuits described herein include additional elements in series and/or in parallel with the described elements.

Based on the applied bias modulation amplitude (modulation depth) of different gyroscopes, different embodiments of the circuits 10, 11 and 12 shown herein will be preferred. For example, the circuits 11 and 12 of FIGS. 5 and 6 are the better circuits for gyroscopes having ¾ π modulation, while the circuit 10 of FIG. 3 is a better circuit for gyroscopes having π/2 modulation.

FIG. 9 is a flow diagram representative of a method 900 of extending an operating range and improving a linearity of an output of a circuit in accordance with the present invention. The circuit described with reference to method 900 is either circuit 10, 11 or 12.

At block 902, output from a device 50 switching between at least two levels is received at an inverting input of a rate amplifier 100, 101 or 102 in the circuit 10, 11 or 12, respectively.

At block 904, feedback is provided to the rate amplifier 100, 101 or 102 via at least one switching device. In one implementation of this embodiment, the switching device is least one PNP bipolar junction transistor. In circuit 10, as described above with reference to FIG. 3, the feedback is provided to the rate amplifier 100 via bipolar junction transistors 200 and 201. In circuit 11, as described above with reference to FIG. 5, the feedback is provided to the rate amplifier 101 via the PNP bipolar junction transistor 300. In circuit 12, as described above with reference to FIG. 6, the feedback is provided to the rate amplifier 102 via the PNP bipolar junction transistor 400 and NPN bipolar junction transistor 401.

At block 906, an output of the rate amplifier is clamped when the device transitions beyond at least one level of the at least two levels while simultaneously the linear operating range of the circuit is extended. For example, the rate amplifiers 100, 101, and 102 in the circuits 10, 11, and 12, respectively, are clamped when the device transitions from level A to a level beyond level B, such as level C.

For a plurality of transitioning events (switching of the device 50 from one level to another level), a percentage of linear transitioning events (e.g., transitioning events that fall below the desired clamp level $V_c \leq V_d$, either with or without clamping as needed) is increased over the extended operating range. For a plurality of transient events, a percentage of clamped transient events (e.g., transient events that are clamped to the desired clamp level $V_c \leq V_d$) is increased for an extended operating range. As defined herein, a linear transitioning event is a transitioning event that results in a highly linear transfer function from the rate amplifier. Thus, the linear transitioning events provide reduced distortion of voltage waveforms that are otherwise within the safe operating range of the electronic components.

FIG. 10 is a flow diagram representative of a method 1000 of extending an operating range and improving a linearity of an output of a circuit receiving input from an interferometric fiber optic gyroscope (IFOG) in accordance with the present invention. The circuit described with reference to method 1000 is either circuit 10, 11 or 12.

At block 1002, output from an IFOG 50 transitioning between two levels is received at an input of a rate gyroscope amplifier 100, 101 or 102 in the circuit 10, 11 or 12, respectively.

At block 1004, feedback is provided to the rate gyroscope amplifier 100, 101 or 102 via a switching device. In one implementation of this embodiment, the switching device is least one PNP bipolar junction transistor. In circuit 10, as described above with reference to FIG. 3, the feedback is provided to the rate amplifier 100 via bipolar junction transistors 200 and 201 by: connecting a collector 270 of the PNP bipolar junction transistor 200 to the inverting input 105 of the rate amplifier 100; connecting a collector 280 of the NPN bipolar junction transistor 201 to the inverting input 105 of the rate amplifier 100; connecting an output of a positive voltage source 210, an anode 225 of the first diode 220, and the cathode 227 of the second diode 221 to the base 272 of the PNP bipolar junction transistor 200; and connecting an output of the negative voltage source 211, the anode 235 of the third diode 230, and the cathode 237 of the fourth diode 231 to the base 282 of the NPN bipolar junction transistor 201.

In circuit 11, as described above with reference to FIG. 5, the feedback is provided to the rate amplifier 101 via the PNP bipolar junction transistor 300 by: connecting the output 117 of the rate amplifier 101 to the emitter 371 of the PNP bipolar junction transistor 300; connecting the collector 370 of the PNP bipolar junction transistor 300 to the inverting input 115 of the rate amplifier 101; and connecting the base 372 of the PNP bipolar junction transistor 300 to a node 312 between the first resistor 310 and the second resistor 311 that are in series with each other.

In circuit 12, as described above with reference to FIG. 6, the feedback is provided to the rate amplifier 102 via the PNP bipolar junction transistor 400 and NPN bipolar junction transistor 401 by: connecting the output 127 of the rate amplifier 102 to the emitter 461 of the PNP bipolar junction transistor 400; connecting the collector 460 of the PNP bipolar junction transistor 400 to the inverting input 125 of the rate amplifier 102 via a resistor 323; and connecting the base 462 of the PNP bipolar junction transistor 400 to a node 412 between the first resistor 320 and the second resistor 321 that are in series with each other; connecting the collector 460 of the PNP bipolar junction transistor 400 to a base 472 of an NPN bipolar junction transistor 401; connecting the collector 470 of the NPN bipolar junction transistor 401 to the output 127 of the rate amplifier 102; and connecting the emitter 471 of the NPN bipolar junction transistor 400 to the input 125 of the rate amplifier 102 via a third resistor 322.

At block 1006, an output of the rate gyroscope amplifier 100, 101 or 102 is clamped when the IFOG 50 transitions beyond at least one level of the at least two levels. For example, the rate gyroscope amplifiers 100, 101, and 102 in the circuits 10, 11, and 12, respectively, are clamped to a desired clamp level $V_c$ when the IFOG 50 transitions from level A to a level beyond level B, such as level C. For a plurality of transitioning events (switching of the IFOG 50 from one level to another level), a percentage of linear transitioning events (e.g., transitioning events that fall below the desired clamp level $V_c \leq V_d$, either with or without clamping as needed) is increased over an extended operating range. For a plurality of transient events, the percentage of clamped transient events (e.g., transient events that are clamped to the desired clamp level $V_c \leq V_d$) is increased for an extended operating range. In circuit 10 (FIG. 3), the precision voltage sources 210 and 211 are switched out to provide the clamp adjustment. In one implementation of this embodiment, the precision voltage sources 210 and 211 are tunable, and the precision voltage sources 210 and 211 are tuned to provide the clamp adjustment. In circuits 11 and 12 (FIGS. 5 and 6, respectively), the resistors 311 or 321 are replaced by resistors of different resistance values in order to provide an adjustment for clamp action voltage. In one implementation of this embodiment, the resistors 311 or 321 are tunable and the resistance value is tuned in order to provide an adjustment for clamp action voltage. In this manner, for a plurality of transitioning events, the percentage of clamped transient events is increased for an extended operating range.

Although specific embodiments have been illustrated and described herein, it will be appreciated by those skilled in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A clamp-point active circuit comprising:
   a rate amplifier configured to receive an output from a device transitioning between at least two levels; and
   at least one switching device configured to receive an output from the rate amplifier, the at least one switching device in at least one respective feedback loop of the rate amplifier, wherein at least one collector of the at least one switching device is directly connected to the rate amplifier, wherein a switching of the at least one switching device causes the rate amplifier to amplify with high linearity in a desired operating range and to clamp outputs received from the transitioning device that are outside the desired operating range to a fixed level, wherein the at least one switching device comprises:
      an NPN bipolar junction transistor, wherein a collector of the NPN bipolar junction transistor is directly connected to an inverting input of the rate amplifier; and
      a PNP bipolar junction transistor, wherein a collector of the PNP bipolar junction transistor is directly connected to the inverting input of the rate amplifier.

2. The circuit of claim 1, wherein the device transitioning between at least two levels is an interferometric fiber optic gyroscope (IFOG) and the rate amplifier is a rate gyroscope amplifier.

3. The circuit of claim 1, further comprising:
   a positive voltage source;
   a first diode; and
   a second diode, wherein an output of the positive voltage source, an anode of the first diode, and a cathode of the second diode are connected to a base of the PNP bipolar junction transistor.

4. The circuit of claim 3, further comprising:
   a negative voltage source;
   a third diode; and
   a fourth diode, wherein an output of the negative voltage source, an anode of the third diode, and a cathode of the fourth diode are connected to a base of the NPN bipolar junction transistor.

5. A method of extending an operating range and improving a linearity of an output of a circuit, the method comprising:
   connecting a collector of an NPN bipolar junction transistor directly to an inverting input of the rate amplifier;
   connecting a collector of a PNP bipolar junction transistor directly to the inverting input of the rate amplifier;
   receiving output from a device transitioning between at least two levels at the inverting input of the rate amplifier in the circuit; and
   clamping an output of the rate amplifier when the device transitions beyond at least one level of the at least two levels, while simultaneously extending the linear operating range of the circuit.

6. The method of claim 5, further comprising:
   providing feedback to the rate amplifier via at least one switching device.

7. The method of claim 5, further comprising:
   providing the circuit, the circuit further including a rate feedback network, wherein the circuit is independent of voltages external to the rate feedback network and wherein the circuit is independent of networks external to the rate feedback network.

8. The method of claim 6, further comprising:
   connecting an output of a positive voltage source, an anode of a first diode, and a cathode of a second diode to a base of the PNP bipolar junction transistor; and
   connecting an output of a negative voltage source, an anode of a third diode, and a cathode of a fourth diode to a base of the NPN bipolar junction transistor.

9. The method of claim 8, further comprising:
   connecting a cathode of the first diode to an emitter of the PNP bipolar junction transistor and to the output of the rate amplifier; and
   connecting an anode of the fourth diode to an emitter of the NPN bipolar junction transistor and to the output of the rate amplifier.

10. The method of claim 5, wherein clamping the output of the rate amplifier comprises:
    using a bipolar-junction transistor switching action in the circuit to output an improved transfer function with linearity in a desired operating range and to clamp inputs outside of the desired operating range to a fixed level.

11. The method of claim 5, wherein receiving the output from the device transitioning between the at least two levels at the inverting input of the rate amplifier in the circuit comprises receiving output from an interferometric fiber optic gyroscope transitioning between the at least two levels at an inverting input of a rate gyroscope amplifier in the circuit, the method further comprising providing feedback to the rate gyroscope amplifier via at least one PNP bipolar junction transistor.

12. A clamp-point active circuit comprising:
    a rate gyroscope amplifier configured to receive output from an interferometric fiber optic gyroscope transitioning between at least two levels; and
    a PNP bipolar-junction transistor in a feedback loop of the rate gyroscope amplifier, wherein a collector of the PNP bipolar junction transistor is directly connected to an inverting input of the rate amplifier, wherein a switching of the PNP bipolar-junction transistor causes the rate gyroscope amplifier to output a transfer function with linearity in a desired operating range, and wherein, if outputs received from the interferometric fiber optic gyroscope are outside the desired operating range, an output of the rate gyroscope amplifier is clamped to a fixed level;
    an NPN bipolar junction transistor, wherein a collector of the NPN bipolar junction transistor is directly connected to the inverting input of the rate gyroscope amplifier;
    a feedback capacitor in parallel to the inverting input and the output of the rate gyroscope amplifier;
    a feedback resistor in parallel to the inverting input and the output of the rate gyroscope amplifier.

13. The circuit of claim 12, further comprising:
    a positive voltage source;
    a first diode;

a second diode, wherein an output of the positive voltage source, an anode of the first diode, and a cathode of the second diode are connected to a base of the PNP bipolar junction transistor, and wherein the cathode of the first diode is connected via a first resistor to the output of the rate gyroscope amplifier;

a negative voltage source;

a third diode; and a fourth diode, wherein an output of the negative voltage source, an anode of the third diode, and a cathode of the fourth diode are connected to a base of the NPN bipolar junction transistor and wherein an anode of the fourth diode is connected via a second resistor to the output of the rate gyroscope amplifier.

* * * * *